US009111814B2

(12) United States Patent
Liu et al.

(10) Patent No.: US 9,111,814 B2
(45) Date of Patent: Aug. 18, 2015

(54) ARRAY SUBSTRATE, MANUFACTURING METHOD THEREOF AND LCD

(75) Inventors: Xiang Liu, Beijing (CN); Jianshe Xue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/313,132

(22) Filed: Dec. 7, 2011

(65) Prior Publication Data
US 2012/0162585 A1  Jun. 28, 2012

(30) Foreign Application Priority Data

Dec. 22, 2010  (CN) .......................... 2010 1 0601911

(51) Int. Cl.
*G02F 1/1333* (2006.01)
*H01L 27/12* (2006.01)
*G02F 1/1362* (2006.01)

(52) U.S. Cl.
CPC ...... *H01L 27/1288* (2013.01); *G02F 1/136286* (2013.01); *G02F 2001/13625* (2013.01); *G02F 2001/136236* (2013.01); *G02F 2001/136295* (2013.01)

(58) Field of Classification Search
CPC ................ G02F 1/136286; G02F 2001/13625; G02F 2001/136295; G02F 2001/136236; H01L 27/1288
USPC ............... 349/42–45; 438/584–688, 942–952
See application file for complete search history.

(56) References Cited

U.S. PATENT DOCUMENTS

| 2005/0219435 | A1  | 10/2005 | Oh et al. |
| 2010/0208155 | A1* | 8/2010  | Gao ............................... 349/43 |
| 2011/0013106 | A1* | 1/2011  | Liu ............................... 349/46 |

FOREIGN PATENT DOCUMENTS

CN         101807550 A    8/2010

OTHER PUBLICATIONS

First Chinese Office Action dated Aug. 9, 2013; Appln. No. 201010601911.1.
Second Chinese Office Action dated Apr. 14, 2014; Appln. No. 201010601911.1.
Chinese Rejection Decision dated Jul. 3, 2014; Appln. No. 201010601911.1.

* cited by examiner

*Primary Examiner* — Richard Kim
*Assistant Examiner* — Kendrick Hsu
(74) *Attorney, Agent, or Firm* — Ladas & Parry LLP

(57) ABSTRACT

There is disclosed an array substrate which has a base substrate and data lines and gate lines on the base substrate, The data lines and gate lines intersect with each other to define pixel units, and each pixel unit comprises a pixel electrode, a gate electrode, a source electrode, a drain electrode and an active layer, and the pixel electrode, the gate electrode and the gate line adjoin to the base substrate, and the gate electrode is formed of a same material as that for forming the pixel electrode.

5 Claims, 5 Drawing Sheets

ARRAY SUBSTRATE, MANUFACTURING METHOD THEREOF AND LCD

BACKGROUND

Embodiments of the disclosed technology relate to an array substrate, a manufacturing method for an array substrate, and a liquid crystal display (LCD).

LCDs have become common in applications, and especially TFT-LCDs (Thin Film Transistor Liquid Crystal Displays) have been prevailing in the market.

An array substrate is an important component of a LCD. The array substrate can be manufactured through a set of patterning processes each comprising thin film deposition steps and photolithograph steps with one photolithograph step for one layer of pattern. Generally, one patterning process comprises: depositing a thin film on a base substrate, applying a layer of photoresist on the surface of the thin film, forming a photoresist pattern with a mask plate having the pattern to be formed, then etching the underlying thin film to transfer the pattern to the thin film. Each layer of pattern should be precisely laid on another layer of pattern, and the materials of the pattern layers may be the same or not with thickness from hundreds nanometers to several micrometers.

The existing array substrates are typically manufactured through a four-mask process, which comprises: forming gate electrodes and gate lines on a base substrate in the first patterning process; forming patterns comprising data lines, active layers, source and drain electrodes in the second patterning process with a double-tone mask plate such as a half tone mask plate or a grey tone mask plate; forming a passivation pattern including passivation via holes in the third patterning process; and forming a pattern comprising pixel electrodes in the fourth patterning process.

FIG. 1A shows a partial structural schematic top view of an existing typical array substrate; FIG. 1B shows a structural schematic sectional view taken along with line A-A in FIG. 1A. As shown in FIG. 1A and FIG. 1B, the array substrate manufactured with the existing four-mask process comprises: a base substrate 1, data lines 5 and gate lines 2 that intersect with each other on the base substrate 1, and pixel units in a matrix array that are defined by the data lines 5 and gate lines 2; each pixel unit comprises a thin film transistor (TFT) switch element T and a pixel electrode 11. The TFT switch element T comprises a gate electrode 3, a source electrode 7, a drain electrode 8 and an active layer 6; the gate electrode 3 is connected with a gate line 2, the source electrode 7 is connected with a data line 5, and the drain electrode 8 is connected with the pixel electrode 11 through a passivation layer via hole 10 in a passivation layer 9; the active layer 6 is formed between the layer of the source electrode 7 and the drain electrode 8 and the layer of the gate electrode 3, a gate insulating layer 4 is formed between the gate electrode 3 and the active layer 6, and the passivation layer 9 is formed between the pixel electrode 11 and the drain electrode 8. The patterns of the gate lines 2, the data lines 5, the gate electrodes 3, the source electrodes 7, the drain electrodes 8, the pixel electrodes 11, and so on can be collectively referred to as conductive layer patterns, while the patterns of the gate insulating layer 4 and the passivation layer 9 can be collectively referred to as insulation layer patterns.

In the pixel unit structure of the array substrate formed by the existing four-mask process, the source electrode 7 and the drain electrode 8 are overlapped in part with the gate electrode 3, forming a parasitic capacitor Cgs therebetween, and the value of the parasitic capacitance is related to the overlapping area between the gate electrode 3 and the source electrode 7 or the drain electrode 8. Because the gate electrodes formed in the existing process typically have a relatively big thickness of, e.g., 3000~6000 Å, the gate electrodes at different positions on the base substrate have different grade angles, which cannot be formed identically in a precise way, along their sides, and this results in different overlapping areas between the drain electrodes or the source electrodes and the gate electrodes and further makes parasitic capacitance in different pixel units over the entire array substrate different from one another to a great degree.

In addition, the relationship between the value of the parasitic capacitance and the kickback voltage $\Delta Vp$ can be expressed in the following equation (1):

$$\Delta V_p = (V_{gh} - V_{gl})\frac{C_{gs}}{C_{gs} + C_{lc} + C_s} \quad (1)$$

where $\Delta Vp$ is referred to as "kickback voltage," Vgh is a high level transmitted over the gate line, Vgl is a low level transmitted over the gate line, Cgs is parasitic capacitance, Cs is storage capacitance, and Clc is liquid crystal capacitance. It can be known from the equation (1) that $\Delta Vp$ varies with the change of the parasitic capacitance Cgs, which makes non-uniform the $\Delta Vp$ over the entire array substrate, and this non-uniformity is difficult to be compensated with a driving circuit.

From the above, it can be seen that different pixel units over the array substrate have parasitic capacitance different from one another to a relatively great degree, and during the operation of the array substrate, it is difficult to adjust $\Delta Vp$ on the overall array substrate, resulting in flickering of the displayed images and degraded display quality of the LCD.

SUMMARY

An embodiment of the disclosure provides method for manufacturing an array substrate, comprising a step to form conductive layer patterns and insulation layer patterns on a base substrate, wherein the conductive layer patterns at least comprise a gate line, a gate electrode, an active layer, a source electrode, a drain electrode, a data line and a pixel electrode, and wherein forming of the gate line, the gate electrode, and the pixel electrode comprises: sequentially forming a transparent conductive thin film and a gate metal thin film on the base substrate; with a double-tone mask plate, patterning the transparent conductive thin film and the gate metal thin film to form the gate line and further patterning the gate metal thin film to form the gate electrode and the pixel electrode.

Another embodiment of the disclosure provides an array substrate comprising a base substrate and data lines and gate lines on the base substrate, wherein the data lines and gate lines intersect with each other to define pixel units, and each pixel unit comprises a pixel electrode, a gate electrode, a source electrode, a drain electrode and an active layer, and wherein the pixel electrode, the gate electrode and the gate line adjoin to the base substrate, and the gate electrode is formed of a same material as that for forming the pixel electrode.

Further another embodiment of the disclosure provides liquid crystal display (LCD) comprising: a liquid crystal panel, comprising: a color filter substrate and the above-described array substrate, the two substrates are assembled together opposite to each other, wherein a liquid crystal layer is interposed between the color filter substrate and the array substrate.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

The present disclosure will become more fully understood from the detailed description given hereinafter and the accompanying drawings which are given by way of illustration only, and thus are not limitative of the present disclosure and wherein.

DETAILED DESCRIPTION

Figure 1A:
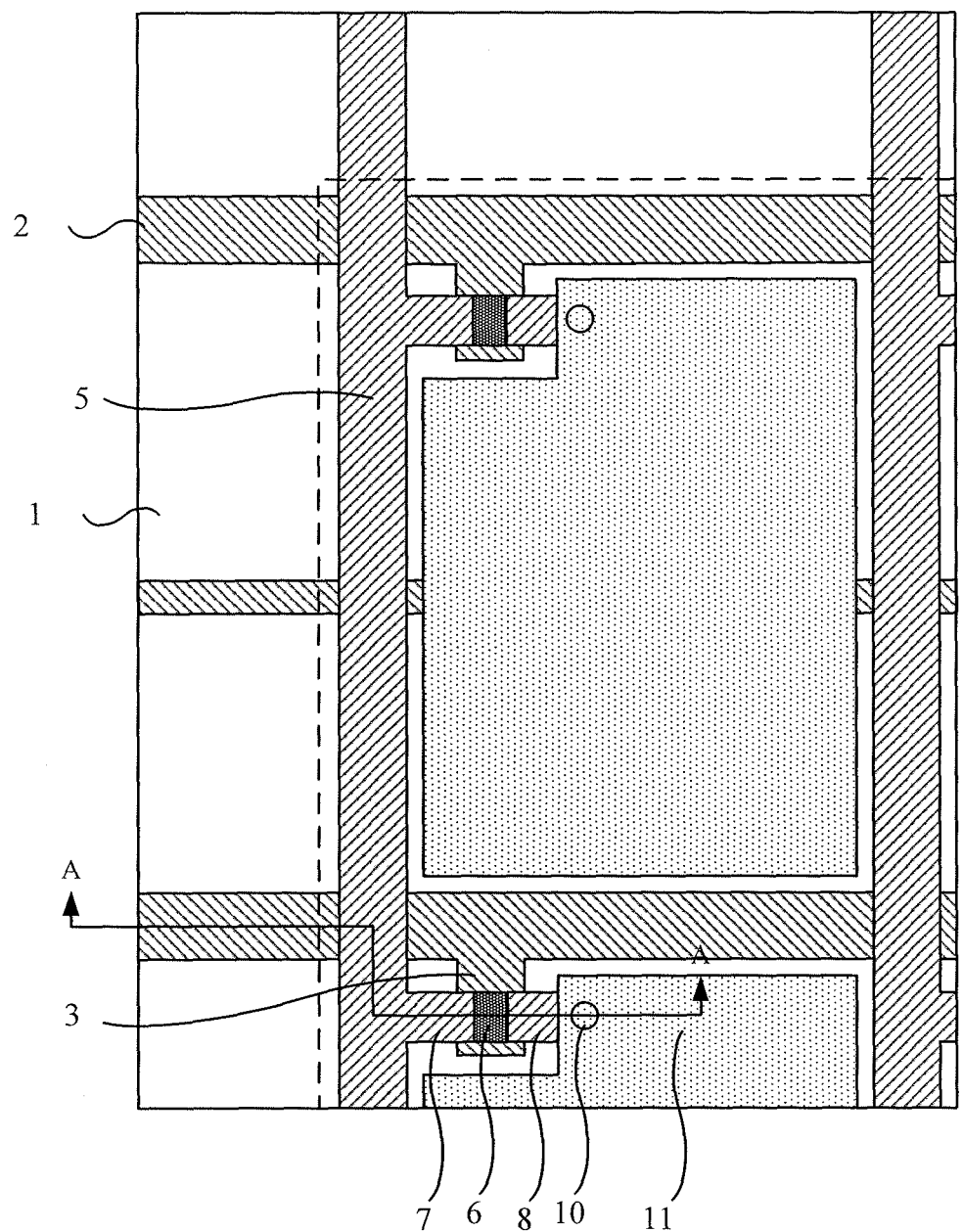
FIG. 1A shows a partial structural schematic top view of an existing typical array substrate.
Figure 1B:
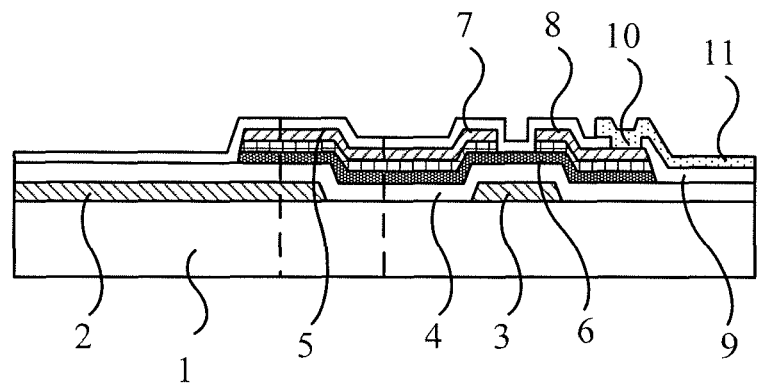
FIG. 1B shows a structural schematic sectional view taken along with line A-A in FIG. 1A.

To make objectives, technical solutions and advantages provided by the embodiments of the present disclosure more clearly, a clear and full description will be made to the technical solutions of embodiments of present disclosure hereinafter in connection with the accompanying drawings. Apparently, rather than all the embodiments, embodiments to be described are only a part of embodiments of present disclosure. Based on the embodiments of the present disclosure, other embodiments conceived by those skilled in the art without inventive work would fall within the scope of present disclosure

First Embodiment

The first embodiment of the disclosed technology provides a method for manufacturing an array substrate, which comprises the steps for forming conductive layer patterns and insulation layer patterns on a base substrate, the conductive layer patterns at least comprise a gate line, a gate electrode, an active layer, a source electrode, a drain electrode, a data line and a pixel electrode for each pixel unit. The process to form the gate line, the gate electrode and the pixel electrode comprises the following steps.

Step 210, sequentially forming a transparent conductive thin film and a gate metal thin film on a base substrate;

Step 220, with a double-tone mask plate, patterning the transparent conductive thin film and the gate metal thin film to form a pattern comprising a gate line and further patterning the gate metal thin film to form a pattern comprising the gate electrode and pixel electrode. The double-tone mask plate may be a half tone mask plate or a grey tone mask plate.

In this embodiment, the gate line, the gate electrode and the pixel electrode can be formed on the base substrate by one photolithograph process, in which after sequentially forming the transparent conductive thin film and the gate metal thin film on the base substrate, the transparent conductive thin film and the gate metal thin film are etched in the patterning process to form the pattern comprising the gate line, and the transparent conductive thin film is etched to form the pattern comprising the gate electrode and the pixel electrode, thus the gate electrode can be formed along with the transparent conductive thin film for the pixel electrode in the same step. For example, the gate electrode formed with a transparent conductive thin film of nano-ITO (Indium Tin Oxide) of a thickness of 400 Å with the method for manufacturing an array substrate of this embodiment have a smaller thickness compared with the conventional gate electrode formed with a gate metal thin film of a thickness of 2000 Å. Therefore, in this embodiment, even if the grade angles of the gate electrodes of the pixel units over the array substrate are not changed compared with the conventional gate electrode, because the thickness of the gate electrodes become smaller, the overlapping areas between the gate electrode and the source and drain electrodes become less, rendering parasitic capacitance of the pixel units smaller and more uniform over the entire array substrate. Thus, the variance of ΔVp become smaller over the entire array substrate, and the problems that are invoked due to the great change of ΔVp are resolved, flickering of the displayed images can be avoided, and the display quality can be improved.

The method for manufacturing the array substrate according to the embodiment can be implemented in many ways, and for example, the active layer, the source and drain electrodes, and the data lines can be formed in different ways.

Second Embodiment

The second embodiment of the disclosed technology provides a method for manufacturing an array substrate, comprising the following steps.

Step 310, sequentially forming a transparent conductive thin film and a gate metal thin film on a base substrate.

On the base substrate such as a glass substrate, a quartz substrate or a plastic substrate, a transparent conductive thin film of a thickness of 300~600 Å and a gate metal thin film of a thickness of 1000~4000 Å are sequentially formed by a sputtering method or a thermal evaporation method. The transparent conductive thin film may be an ITO or an nano-IZO (Indium Zinc Oxide) thin film, or may be other kind of transparent metal or conductive metal oxide thin film; the gate metal thin film may be a single layer of Cr, W, Ti, Ta, Mo, Al, Cu or any alloy thereof, or may be in composite layers of a combination of the above metal materials.

Step 320, with a double-tone mask plate, patterning the transparent conductive thin film and the gate metal thin film to form a pattern comprising a gate line and further patterning the gate metal thin film to form a pattern comprising the gate electrode and pixel electrode. The double-tone mask plate may be a half tone mask plate or a grey tone mask plate.

In an example, Step 320 can be implemented in the following steps.

Step 321, applying a layer of photoresist on the gate metal thin film;

Step 322, exposing the photoresist with a double-tone mask plate and developing the exposed photoresist to form a photoresist pattern comprising a photoresist-retained region, a photoresist-partially-retained region and a photoresist-removed region, and the thickness of the photoresist layer in the photoresist-retained region is larger than that in the photoresist-partially-retained region;

Step 323, conducting a first etching to remove the gate metal thin film and the transparent conductive thin film in the photoresist-removed region, and forming the pattern comprising the gate line;

Step 324, conducting an ashing process to remove the photoresist by the thickness of the photoresist in the photoresist-partially-retained region, after which the photoresist in the photoresist-retained region is still retained in part to cover the underlying metal thin film, thus the formed pattern of the gate line in the photoresist-retained region is protected from being etched in the subsequent etching steps.

Figure 2A:
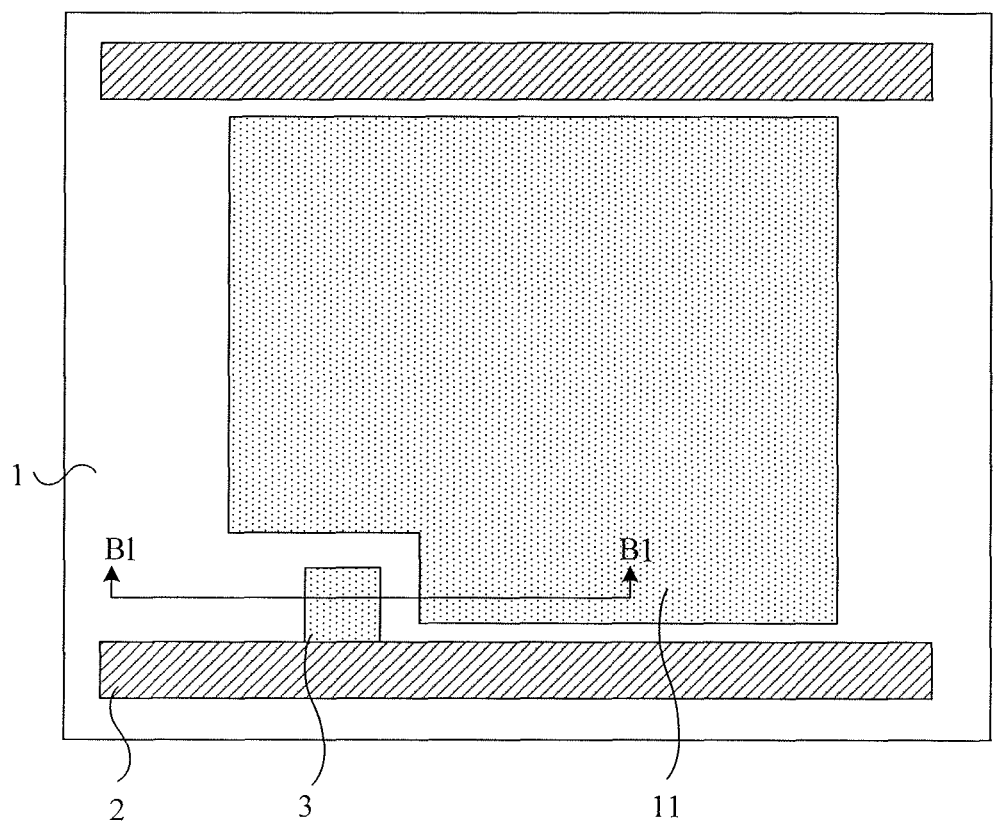
FIG. 2A shows a partial structural schematic top view of the base substrate formed with a gate line, a gate electrode and a pixel electrode in the method for manufacturing the array substrate according to the second embodiment of the disclosed technology.

Step 325, conducting a second etching to remove the gate metal thin film exposed in the photoresist-partially-retained region to form a pattern comprising the gate electrode and pixel electrode; and Step 326, removing the remained photoresist, as shown in FIG. 2A and FIG. 3C.

Figure 2B:
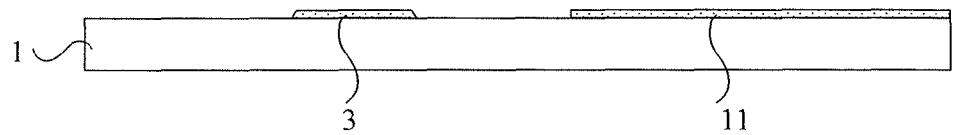
FIG. 2B shows a structural schematic sectional view taken along with line B1-B1 in FIG. 2A.

FIG. 2A shows a partial structural schematic top view of the base substrate comprising the patterns of the gate line, the gate electrode and the pixel electrode in the method for manufacturing an array substrate according to the second embodiment of the disclosed technology; FIG. 2B shows a structural schematic sectional view taken along with line B1-B1 in FIG. 2A. As shown in FIGS. 2A and 3C, after Step 320 (e.g., from Step 321 to Step 326), the patterns of the gate line 2, the gate electrode 3 and the pixel electrode 11 can be formed on the base substrate 1.

Step 330, forming a gate insulating layer and an active layer thin film on the base substrate formed with the gate line 2, the gate electrode 3 and the pixel electrode 11.

In an example, the process to form an active layer thin film on the base substrate formed with the gate line 2, the gate electrode 3 and the pixel electrode 11 can be conducted as follows. A semiconductor layer of a thickness of 1000~3000 Å and a doped semiconductor layer (i.e., an ohmic contact layer) of a thickness of 500~1000 Å are sequentially formed on the base substrate, and the semiconductor material may be amorphous silicon or micro-crystal silicon, for example; alternatively, a semiconductor layer of a thickness of 100~1500 Å is formed on the base substrate, and this semiconductor layer is made of a metal oxide such as IGZO (In—Ga—Zn—O).

On the base substrate 1 after Step 320 formed with the gate line 2, the gate electrode 3 and the pixel electrode 11, a gate insulating layer 4 of a thickness of 3000~5000 Å, a semiconductor layer of a thickness of 1000~3000 Å, and a heavily doped semiconductor layer of a thickness of 500~1000 Å can be sequentially formed with a PECVD (Plasma Enhanced Chemical Vapor Deposition) method. The gate insulating layer may be oxide, nitride, or oxynitride, and accordingly, the reacting gases for the material in the method may be $SiH_4$, $NH_3$ and $N_2$ or $SiH_2Cl_2$, $NH_3$ and $N_2$; and the reacting gases for the semiconductor layer may be $SiH_4$ and $H_2$ or $SiH_2Cl_2$ and $H_2$. The reacting gases for the heavily doped semiconductor layer may be $SiH_4$, $PH_3$ and $H_2$ or $SiH_2Cl_2$, $PH_3$ and $H_2$.

In addition, the active layer thin film may only comprise a metal oxide having high mobility, for example, a-IGZO (amorphous Indium Gallium Zinc Oxide), as the semiconductor layer. Because the oxide has a work function that is close to that of the later formed source and drain metal film, the contact resistance between the metal oxide and the source and drain metal film is small, the metal oxide as the semiconductor material can directly contact with the source and drain metal film, and it is not necessary to include a heavily doped semiconductor layer for reducing the contact resistance between the semiconductor layer and the source and drain metal film. In this way, the process to form the heavily doped semiconductor layer can be omitted, and the property of the formed TFT can be improved.

Step 340, with a double-tone mask plate, patterning the active layer thin film and the gate insulating layer to form a pattern comprising a contact via hole, and patterning the active layer thin film to form a pattern comprising the active layer;

In one example, the Step 340 can be implemented with the following steps.

Figure 2C:
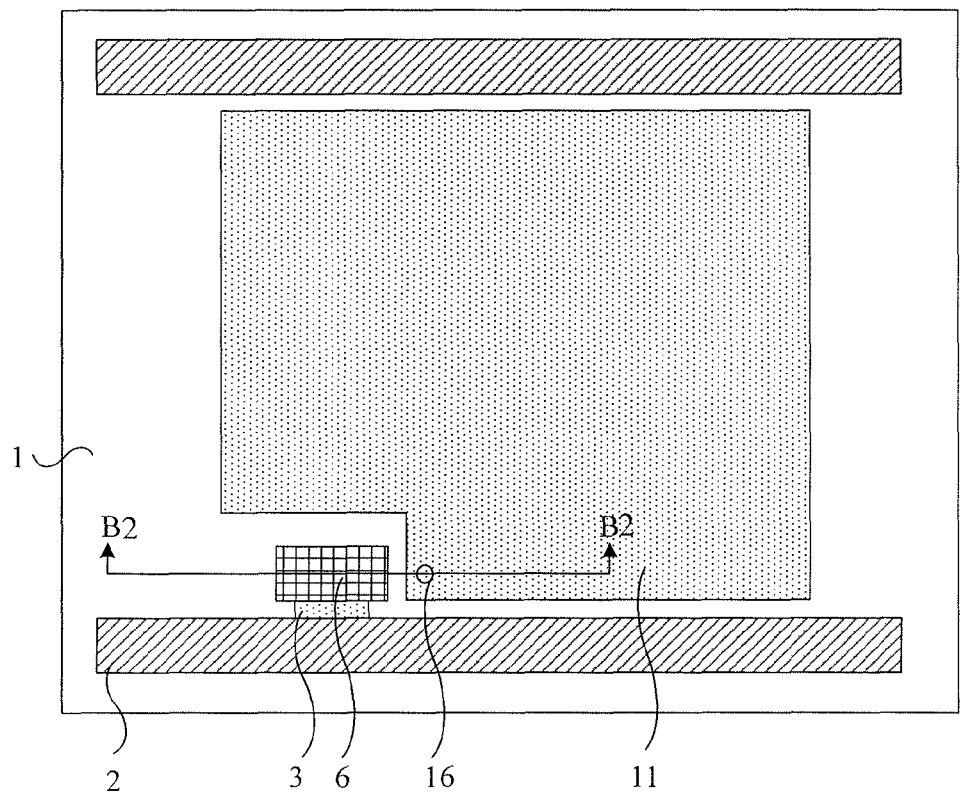
FIG. 2C shows a partial structural schematic top view of the base substrate formed with an active layer and a contact via hole in the method for manufacturing the array substrate according to the second embodiment of the disclosed technology.

Step 341, applying a layer of photoresist on the active layer thin film;

Step 342, with a double-tone mask plate, exposing the layer of photoresist to form a photoresist pattern comprising a photoresist-retained region, a photoresist-partially-retained region, and a photoresist-removed region, wherein the thickness of the photoresist layer in the photoresist-retained region is larger than that in the photoresist-partially-retained region;

Step 343, conducting a first etching to remove the active layer thin film and the gate insulating layer in the photoresist-removed region to form the pattern comprising the contact via hole;

Step 344, conducting an ashing process to remove the photoresist by the thickness of the photoresist in the photoresist-partially-retained region;

Step 345, conducting a second etching to remove the active layer exposed in the photoresist-partially-retained region and to form the pattern comprising the active layer; and Step 346, removing the remained photoresist, as shown in FIGS. 2C and 3E.

Figure 2D:
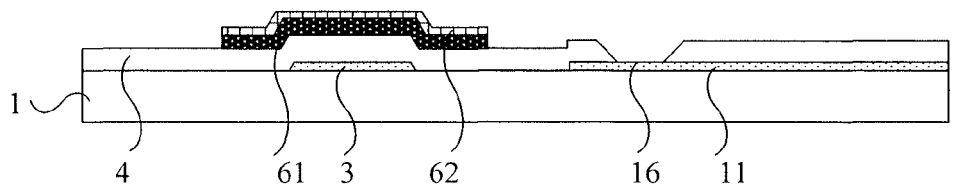
FIG. 2D shows a structural schematic sectional view taken along with line B2-B2 in FIG. 2C.

FIG. 2C shows a partial structural schematic top view of the base substrate comprising the patterns of the active layer and the contact via hole in the method for manufacturing an array substrate according to the second embodiment of the disclosed technology; FIG. 2D shows a structural schematic sectional view taken along with line B2-B2 in FIG. 2C. As shown in FIGS. 2C and 3E, after Step 340, on the base substrate 1 formed with the gate line 2, the gate electrode 3 and the pixel electrode 11, the patterns comprising the active layer 6 and the contact via hole 16 can be further formed. The active layer 6 may comprise a semiconductor layer 61 and a heavily doped semiconductor layer 62.

Step 350, forming a data line metal film on the bases substrate 1 formed with the active layer 6 and contact via hole 16.

On the bases substrate 1 formed with the active layer 6 and contact via hole 16 after step 340, the data line metal film of a thickness of 2000~3000 Å may be formed by a sputtering or thermal evaporation method, and this data line metal film may be a single layer of Cr, W, Ti, Ta, Mo, Al, Cu or any alloy thereof or may be a composite layer of any combination of the above metal materials. This data line metal film can be referred to as source and drain metal film as well.

Figure 2E:
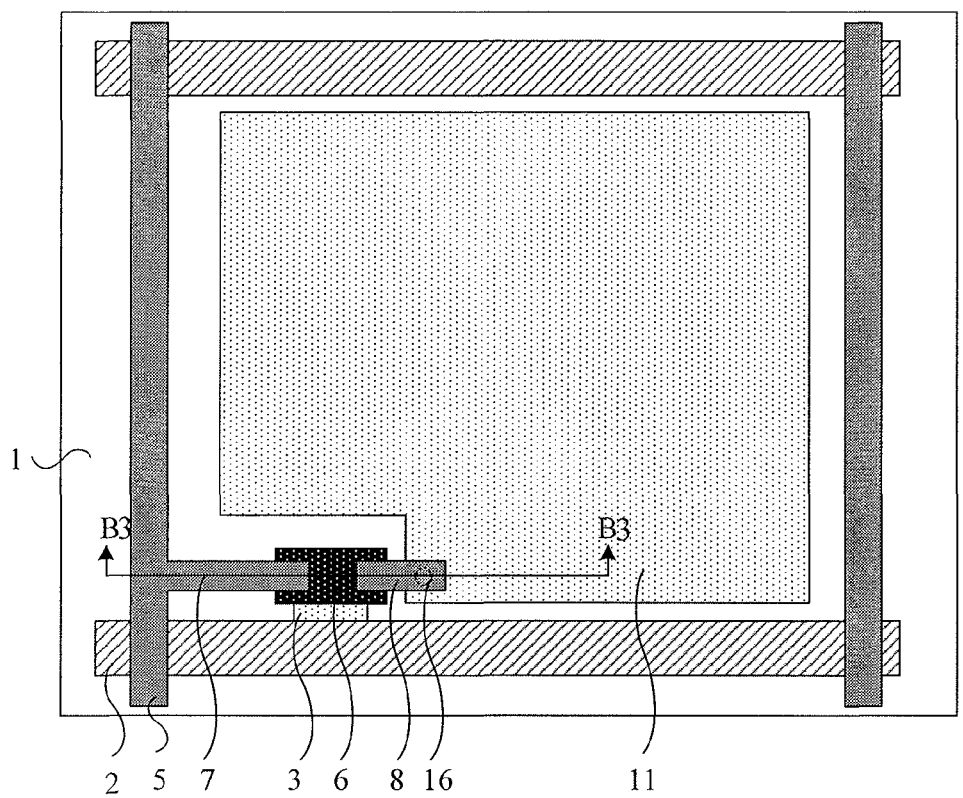
FIG. 2E shows a partial structural schematic top view of the base substrate formed with a data line, a source electrode and a drain electrode in the method for manufacturing the array substrate according to the second embodiment of the disclosed technology of embodiment of the disclosed technology.

Step 360, with a single-tone mask plate (i.e., a normal mask plate), patterning the data line metal film to form patterns comprising a data line 5, a source electrode 7 and a drain electrode 8, and further patterning the active layer 6 to form the patter of a channel region, wherein the drain electrode 8 is connected with the pixel electrode 11 through the contact via hole 16, as shown in FIGS. 2E and 3G.

Figure 2F:
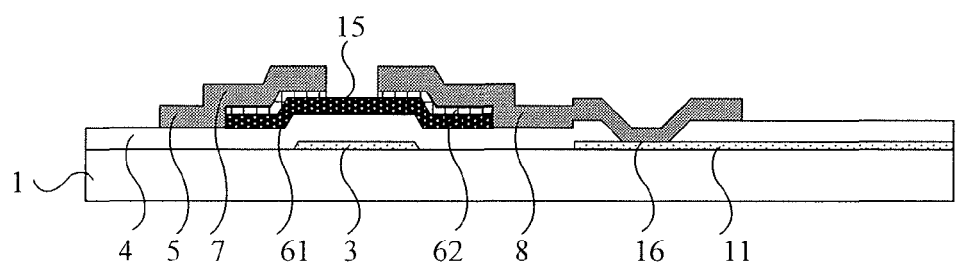
FIG. 2F shows a structural schematic sectional view taken along with line B3-B3 in FIG. 2E.

FIG. 2E shows a partial structural schematic top view of the base substrate comprising the patterns of the data line, the source electrode and the drain electrode in the method for manufacturing an array substrate according to the second embodiment of the disclosed technology; FIG. 2F shows a structural schematic sectional view taken along with line B3-B3 in FIG. 2E. As shown in FIGS. 2E and 3G, after the applied photoresist layer is exposed with a single-tone mask plate and developed to form a photoresist pattern, the data line metal film and the heavily doped semiconductor layer 62 (if there is the heavily doped semiconductor layer, the heavily doped semiconductor layer is etched, and if there is no, only the data line metal film is etched) in photoresist-removed region is removed to form the data line 5, the source electrode 7, the drain electrode 8, and the channel region 15 of a thin film transistor (TFT).

Step 370, forming a passivation layer 9 on the base substrate 1 formed with the data line 5, the source electrode 7 and the drain electrode 8.

On the base substrate 1 formed with the data line 5, the source electrode 7 and the drain electrode 8 after step 360, the passivation layer 9 of a thickness of 1500~3500 Å is formed through a PECVD method. The material of the passivation layer may be oxide, nitride, or oxynitride, and the reacting gases for the materials in the method may be $SiH_4$, $NH_3$ and $N_2$ or $SiH_2Cl_2$, $NH_3$ and $N_2$.

Step 380, with a single-tone mask plate, patterning the passivation layer to form a pattern comprising an interface region via hole.

Figure 2G:
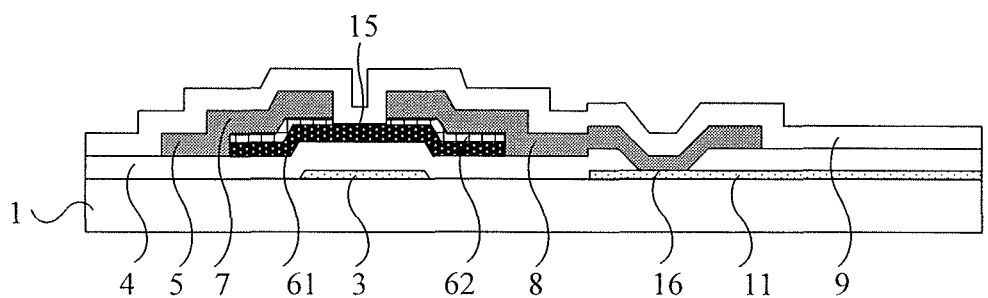
FIG. 2G shows a structural schematic sectional view taken along with line B3-B3 in FIG. 2E after applying a passivation layer and forming an interface region via hole.

Because the passivation layer is typically a transparent thin film layer, the partial structural schematic top view of the base substrate after Step 370 and Step 380 may be the same as that as shown in FIG. 2E; but the interface region via hole is not shown in FIG. 2E and is provided in the peripheral regions around the pixel units on the array substrate. The gate lines or data lines for several or more pixel units can share an interface or pin region. FIG. 2G shows a sectional view after applying and etching the passivation layer to form the interface region via hole along line B3-B3 in FIG. 2E, and in this process, by using a patterning process with a single-tone mask plate, there is formed the pattern comprising the interface region via hole such as a gate line interface region via hole or a data line interface region via hole.

In the above, Step 330 through Step 380 are the steps to form the active layer 6, the source electrode 7, the drain electrode 8 and the data line 5 and the insulation layer patterns on the array substrate.

In this embodiment, after sequentially forming the transparent conductive thin film and the gate metal thin film on the base substrate, the transparent conductive thin film and the gate metal thin film are etched to form the pattern comprising the gate line, the transparent conductive thin film is further etched to form the pattern comprising the gate electrode and the pixel electrode, thus the gate line, the gate electrode and the pixel electrode are formed through only one photolithography process, and the gate electrode is formed with the same transparent conductive thin film as that for forming the pixel electrode. Compared with the conventional gate electrode formed with a gate metal thin film, the gate electrode formed on the array substrate according to this embodiment has a smaller thickness. Therefore, in this embodiment, even if the grade angles of the gate electrodes of the pixel units over the array substrate are not changed compared with the conventional gate electrode, because the thickness of the gate electrodes become smaller, the overlapping areas between the gate electrode and the source and drain electrodes become less, rendering parasitic capacitance of the pixel units smaller and more uniform over the entire array substrate. Thus, the variance of ΔVp become smaller over the entire array substrate, and the problems that are invoked due to the great change of ΔVp are resolved, flickering of the displayed images can be avoided, and the display quality can be improved.

In addition, one lithography process is used to form the active layer pattern comprising a contact via hole with the active layer being connected with the pixel electrode through the contact via hole. The active layer and the source and drain electrodes are formed in two separate photolithograph processes. The pattern of the active layer may extend beyond the opposing end portions of the source electrode and the drain electrode, and after exposing the photoresist layer can have a uniform thickness, thus a photoresist layer can be applied with a relatively larger thickness to avoid a channel overetching (channel open). Further, after the ashing of photoresist, the active layer is patterned with a single-tone mask plate, and then remained photoresist is removed, avoiding a short between the source electrode and the drain electrode due to remained photoresist. In this way, the problems about the short in the channel region of the TFT between the source electrode and the drain electrode and channel overetching can be avoided, improving the yield. Furthermore, the data line metal film for forming the drain electrode is connected with the pixel electrode through the contact via hole; compared with the ITO thin film for forming the pixel electrode being connected with the drain electrode through the passivation layer contact via hole in the conventional method, the data line metal film is thinner than the ITO film, thus when the pixel electrode and the drain electrode can have a big step therebetween, the data line is not easy to subject to a disconnection failure or defect, further improving the yield.

Third Embodiment

The third embodiment of the disclosed technology provides a method for manufacturing an array substrate, comprising the following steps.

Step 410, sequentially forming a transparent conductive thin film and a gate metal thin film on a base substrate.

On the base substrate such as a transparent glass substrate, a quartz substrate or a plastic substrate, a transparent conductive thin film and a gate metal thin film are sequentially formed by the method and material with reference to the description of Step 310, for example.

Step 420, with a double-tone mask plate, patterning the transparent conductive thin film and the gate metal thin film to form a pattern comprising a gate line 2 and further patterning the gate metal thin film to form a pattern comprising the gate electrode 3 and pixel electrode 11, as shown in FIG. 2A and FIG. 2B.

Step 420 may be performed with reference to Step 321 through Step 326 of the second embodiment. After Step 420, the patterns of the gate line 2, the gate electrode 3 and the pixel electrode 11 can be formed on the base substrate 1, as shown in FIG. 2A and FIG. 2B.

Step 430, forming a gate insulating layer and an active layer thin film on the base substrate formed with the gate line, the gate electrode and the pixel electrode.

Step 440, with a single-tone mask plate, patterning the gate insulating layer to form a pattern comprising a contact via hole, as shown in 4B.

Figure 3:
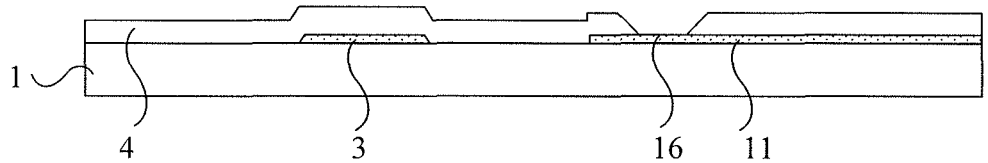
FIG. 3 shows a structural schematic sectional view taken along with line B1-B1 in FIG. 2A after coating a gate insulating layer and forming a contact via hole.

Because the gate insulating layer is generally formed of a transparent insulation material, the partial structural schematic top view of the base substrate with the contract via hole formed in the method according to the third embodiment of the disclosed technology can be referred to that shown in FIG. 2A; FIG. 3 shows a structural schematic sectional view taken along with line B1-B1 in FIG. 2A after applying the gate insulating layer and forming the contact via hole. As shown in FIG. 3, after Step 440, the pattern comprising the contact via hole can be formed on the base substrate with the gate line 2, the gate electrode 3 and the pixel electrode 11.

Step 450, forming an active layer thin film on the base substrate 1 formed with the pattern of the contact via hole 16.

In one example, forming an active layer thin film on the base substrate 1 formed with the pattern of the contact via hole 16 comprises the following steps.

On the base substrate, a semiconductor layer of a thickness of 1000~3000 Å and a heavily doped semiconductor layer of a thickness of 500~1000 Å are sequentially formed, and the semiconductor material may be amorphous silicon or microcrystal silicon; or on the base substrate, a metal oxide of a thickness of 100~1500 Å is formed as the semiconductor layer, and the metal oxide may be IGZO.

The process and material for forming the active layer thin film on the base substrate can be referred to Step 330 of the second embodiment of the disclosed technology, for example.

Step 460, with a single-tone mask plate, patterning the active layer thin film to form the pattern comprising the active layer 6.

In Step 440, the pattern comprising the active layer 6 can be formed on the bases substrate 1, and the active layer 6 may comprise a semiconductor layer 61 and a heavily doped semiconductor layer 62, as shown in FIG. 2C and FIG. 2D.

Step 470, forming a data line metal thin film on the base substrate 1 formed with the active layer 6 and the contact via hole 16. The process and the material for the data line metal thin film on the base substrate can be referred to step 350 of the second embodiment, for example.

Step 480, with a single-tone mask plate, patterning the data line metal thin film to form a pattern comprising a data line 5, a source electrode 7 and a drain electrode 8, and further patterning the active layer 6 to form the pattern of the channel region 15, wherein the drain electrode 8 is connected with the pixel electrode 11 through the contact via hole 16.

In Step 470 and Step 480, the process and the material for forming the data line 5, the source electrode 7 and the drain electrode 8 on the base substrate 1 can be referred to Steps 350 and 360 of the method according to the second embodiment and FIG. 2E and FIG. 2F, for example.

Step 490, forming a passivation layer 9 on the base substrate 1 formed with the data line 5, the source electrode 7 and the drain electrode 8. The process and the material for forming the passivation layer can be referred to Step 370 of the method according to the second embodiment, for example.

Step 400, with a single-tone mask plate, patterning the passivation layer 9 to form a pattern comprising an interface region via hole.

In Step 490 and Step 400, the process and the material for forming the passivation layer 9 and the interface region via hole on the base substrate 1 can be referred to Steps 370 and 380 of the method according to the second embodiment and FIG. 2G, for example. The interface region via hole comprises a gate line interface region via hole or a data line interface region via hole.

In the above, Step 430 through Step 400 are the steps to form the active layer 6, the source electrode 7, the drain electrode 8 and the data line 5 and the insulation layer patterns on the array substrate.

In this embodiment, after sequentially forming the transparent conductive thin film and the gate metal thin film on the base substrate, the transparent conductive thin film and the gate metal thin film are etched to form the pattern comprising the gate line, the transparent conductive thin film is further etched to form the pattern comprising the gate electrode and the pixel electrode, thus the gate line, the gate electrode and the pixel electrode are formed through only one photolithography process, and the gate electrode is formed with the same transparent conductive thin film as that for forming the pixel electrode. Compared with the conventional gate electrode formed with a gate metal thin film, the gate electrode formed on the array substrate according to this embodiment has a smaller thickness. Therefore, in this embodiment, even if the grade angles of the gate electrodes of the pixel units over the array substrate are not changed compared with the conventional gate electrode, because the thickness of the gate electrodes become smaller, the overlapping areas between the gate electrode and the source and drain electrodes become less, rendering parasitic capacitance of the pixel units smaller and more uniform over the array substrate. Thus, the variance of $\Delta Vp$ become smaller over the entire array substrate, and the problems that are invoked due to the great change of $\Delta Vp$ are resolved, flickering of the displayed images can be avoided, and the display quality can be improved.

In addition, the active layer and the source and drain electrodes are formed in two separate photolitograph processes. The pattern of the active layer can extend beyond the opposing end portions of the source electrode and the drain electrode, and after exposing the photoresist layer can have an uniform thickness, thus a photoresist layer can be applied with a relatively larger thickness to avoid a channel overetching (channel open). Further, after the ashing of photoresist, the active layer is patterned with a single-tone mask plate, and then remained photoresist is removed, avoiding a short between the source electrode and the drain electrode due to the remained photoresist. In this way, the problems about the short in the channel region of the TFT between the source electrode and the drain electrode and channel overetching can be avoided, improving the yield. Furthermore, the data line metal film for forming the drain electrode is connected with the pixel electrode through the contact via hole; compared with the ITO thin film for forming the pixel electrode being connected with the drain electrode through the passivation layer contact via hole in the conventional method, the data line metal film is thinner than the ITO film, thus when the pixel electrode and the drain electrode can have a big step therebetween, the data line is not easy to subject to a disconnection failure or defect, further improving the yield.

It should be noted that the steps to form the patterns of the active layer, the source electrode, the drain electrode and the data line and the insulation layer patterns on the array substrate are not limited thereto but can be varied or modified according to the specific requirements in practice.

Fourth Embodiment

With reference to FIG. 2E, the fourth embodiment of the disclosed technology provides an array substrate, which comprises a base substrate 1 and data lines 5 and gate lines 2 formed on the base substrate 1 and intersecting with each other to define pixel units, and each of the pixel units comprises a pixel electrode 11, a gate electrode 3, a source electrode 7, a drain electrode 8, and an active layer 6.

The pixel electrode 11, the gate electrode 3 and the gate line 2 are formed adjoining to the base substrate 1 (close to the base substrate 1), and the gate electrode 3 is formed of the same material as that for the pixel electrode 11.

In this embodiment, the pixel electrode, the gate electrode and the gate line adjoin to the base substrate, and the gate electrode is formed of the same material as that for the pixel electrode and formed along with the pixel electrode in a same step. The gate electrode is formed of a transparent conductive thin film with a relatively small thickness, e.g., 300~600 Å. Compared with the conventional gate electrode formed with a gate metal thin film, the gate electrode of the array substrate according to this embodiment has a smaller thickness. Therefore, in this embodiment, even if the grade angles of the gate electrodes of the pixel units over the array substrate are not changed compared with the conventional gate electrode, because the thickness of the gate electrodes become smaller, the overlapping areas between the gate electrode and the source and drain electrodes become less, rendering parasitic capacitance of the pixel units smaller and more uniform over the array substrate. Thus, the variance of $\Delta Vp$ become smaller over the entire array substrate, and the problems that are invoked due to the great change of $\Delta Vp$ are resolved, flickering of the displayed images can be avoided, and the display quality can be improved.

Fifth Embodiment

The fifth embodiment of the disclosed technology provides an array substrate of a structure with reference to FIG. 2E and FIG. 3H; the array substrate comprises a base substrate 1 and data lines 5 and gate lines 2 formed on the base substrate 1 and intersecting with each other to define pixel units; each of the pixel units comprises a pixel electrode 11, a gate electrode 3, a source electrode 7, a drain electrode 8, and an active layer 6. The pixel electrode 11, the gate electrode 3 and the gate line 2 are formed adjoining to the base substrate 1, and the gate electrode 3 is formed of the same material as that for the pixel electrode 11.

The gate electrode 3 is formed along with the pixel electrode 11 in a same step, and the thin film for forming the pixel electrode are left under the gate line 2, the material for forming the pixel electrode may be a transparent conductive thin film such as ITO or IZO. The processes and the materials for forming the pixel electrode, the gate electrode and the gate line can be referred to Step 301 and Step 302 of the method according to the first embodiment, for example.

Further, the pixel electrode 11, the gate electrode 3 and the gate line 2 are overcoated or covered by a gate insulating layer 4, and the gate insulating layer 4 comprises a contact via hole 16 formed therein.

On the gate insulating layer 4, there are formed the active layer 6, the source electrode 7, the drain electrode 8 and the data line 5, and the drain electrode 8 is connected with the pixel electrode 11 through the contact via hole 16.

The active layer 6, the source electrode 7, the drain electrode 8 and the data line 5 are covered by a passivation layer.

Moreover, the opposing end portions of the source electrode 7 and the drain electrode 8 are located on the active layer 6, and the pattern of the active layer 6 extends beyond the opposing end portions of the source electrode 7 and the drain electrode 8.

In this embodiment, the pixel electrode, the gate electrode and the gate line adjoin to the base substrate, and the gate electrode is formed of the same material as that for the pixel electrode and formed along with the pixel electrode in a same step. The gate electrode is formed of a transparent conductive thin film with a relatively small thickness, e.g., 300~600 Å. Compared with the conventional gate electrode formed with a gate metal thin film, the gate electrode of the array substrate according to this embodiment has a smaller thickness. Therefore, in this embodiment, even if the grade angles of the gate electrodes of the pixel units over the array substrate are not changed compared with the conventional gate electrode, because the thickness of the gate electrodes become smaller, the overlapping areas between the gate electrode and the source and drain electrodes become less, rendering parasitic capacitance of the pixel units smaller and more uniform over the array substrate. Thus, the variance of $\Delta Vp$ become smaller over the entire array substrate, and the problems that are invoked due to the great change of $\Delta Vp$ are resolved, flickering of the displayed images can be avoided, and the display quality can be improved.

In addition, the active layer may comprise a semiconductor layer of a thickness of 1000~3000 Å and a heavily doped semiconductor layer of a thickness of 500~1000 Å; or the active layer may comprise a semiconductor layer of a thickness of 100~1500 Å, which is a metal oxide. The pattern of the active layer may extend beyond the opposing end portions of the source electrode and the drain electrode, and after exposing, the photoresist layer can have an uniform thickness, thus a photoresist layer can be applied with a relatively larger thickness to avoid a channel overetching (channel open). Further, after the ashing of photoresist, the active layer is patterned with a single-tone mask plate, and then remained photoresist is removed, avoiding a short between the source electrode and the drain electrode due to the remained photoresist. In this way, the problems about the short in the channel region of the TFT between the source electrode and the drain electrode and channel overetching can be avoided, improving the yield. Furthermore, the data line metal film for forming the drain electrode is connected with the pixel electrode through the contact via hole; compared with the ITO thin film for forming the pixel electrode being connected with the drain electrode through the passivation layer contact via hole in the conventional method, the data line metal film is thinner than the ITO film, thus when the pixel electrode and the drain electrode can have a big step therebetween, the data line is not easy to subject to a disconnection failure or defect, further improving the yield.

The array substrate of this embodiment can be manufactured with the method provided in any of the other embodiments of the disclosed technology.

Another embodiment of the disclosed technology provides a liquid crystal display (LCD), which comprises a liquid crystal panel; the liquid crystal panel comprises a color filter substrate and an array substrate according to any of the above-described, which are assembled together to opposite to each other with a liquid crystal layer interposed therebetween.

The array substrate of the liquid crystal panel of the LCD according to the embodiment can be manufactured by the any method according to any of the embodiments of the disclosed technology.

In the array substrate of the liquid crystal panel of the LCD according to the embodiment, the pixel electrode, the gate electrode and the gate line adjoin to the base substrate, and the gate electrode is formed of the same material as that for the pixel electrode and formed along with the pixel electrode in a same step. The gate electrode is formed of a transparent conductive thin film with a relatively small thickness, e.g., 300~600 Å. Compared with the conventional gate electrode formed with a gate metal thin film, the gate electrode of the array substrate according to this embodiment has a smaller thickness. Therefore, in this embodiment, even if the grade angles of the gate electrodes of the pixel units over the array substrate are not changed compared with the conventional gate electrode, because the thickness of the gate electrodes become smaller, the overlapping areas between the gate electrode and the source and drain electrodes become less, rendering parasitic capacitance of the pixel units smaller and more uniform over the array substrate. Thus, the variance of ΔVp become smaller over the entire array substrate, and the problems that are invoked due to the great change of ΔVp are resolved, flickering of the displayed images can be avoided, and the display quality can be improved.

The embodiment of the disclosure being thus described, it will be obvious that the same may be varied in many ways. Such variations are not to be regarded as a departure from the spirit and scope of the disclosure, and all such modifications as would be obvious to those skilled in the art are intended to be comprised within the scope of the following claims.

What is claimed is:

1. A method for manufacturing an array substrate, comprising a step to form conductive layer patterns and insulation layer patterns on a base substrate, wherein the conductive layer patterns at least comprise a gate line, a gate electrode, an active layer, a source electrode, a drain electrode, a data line and a pixel electrode, wherein the gate line does not overlap with the gate electrode; and wherein forming of the gate line, the gate electrode, and the pixel electrode comprises:

sequentially forming a transparent conductive thin film and a gate metal thin film on the base substrate;

applying photoresist on the gate metal thin film;

exposing with a double-tone mask plate and developing the photoresist to form a photoresist pattern comprising a photoresist-retained region, a photoresist-partially-retained region and a photoresist-removed region, wherein a photoresist thickness of the photoresist-retained region is larger than that in the photoresist-partially-retained region, the photoresist of the photoresist-retained region merely covers a region for forming the gate line, the photoresist of the photoresist-partially-retained region covers a region for forming the gate electrode and the pixel electrode, and the photoresist-removed region is other regions;

conducting a first etching to remove the gate metal thin film and the transparent conductive thin film in the photoresist-removed region to form the gate line;

ashing to remove the photoresist by the photoresist thickness in the photoresist-partially-retained region;

conducting a second etching to remove the gate metal thin film exposed in the photoresist-partially-retained region to form the gate electrode and the pixel electrode; and removing the remaining photoresist.

2. The method according to claim 1, wherein the step to form the active layer, the source electrode, the drain electrode, the data line and the insulation layer patterns comprises:

forming a gate insulating layer and an active layer film on the base substrate formed with the gate line, the gate electrode, and the pixel electrode;

with a second double-tone mask plate, patterning the active layer film and the gate insulating layer to form a contact via hole and further patterning the active layer film to form the active layer;

forming a data line metal film on the base substrate formed with the active layer and the contact via hole;

with a first single-tone mask plate, patterning the data line metal film to form the data line, the source electrode and the drain electrode and further patterning the active layer to form a channel region, wherein the drain electrode is connected with the pixel electrode through the contact via hole;

forming a passivation layer on the base substrate formed with the data line, the source electrode and the drain electrode; and with a second single-tone mask plate, patterning the passivation layer to form an interface region via hole.

3. The method according to claim 2, wherein the step of patterning the active layer film and the gate insulating layer to form a contact via hole and further patterning the active layer film to form the active layer with the second double-tone mask plate comprises:

applying photoresist on the active layer;

exposing with the second double-tone mask plate and developing the photoresist to form a photoresist pattern comprising a photoresist-retained region, a photoresist-partially-retained region and a photoresist-removed region, wherein a photoresist thickness of the photoresist-retained region is larger than that in the photoresist-partially-retained region;

conducting a first etching to pattern the active layer film and the gate insulating layer in the photoresist-removed region to form the contact via hole;

ashing to remove the photoresist by the photoresist thickness in the photoresist-partially-retained region;

conducting a second etching to pattern the active layer film exposed in the photoresist-partially-retained region to form the active layer; and removing the remaining photoresist.

4. The method according to claim 2, wherein forming the active layer film on the base substrate formed with the gate line, the gate electrode, and the pixel electrode comprises:

forming a semiconductor layer of a thickness of 1000~3000 Å and a heavily doped semiconductor layer of a thickness of 500~1000 Å on the base substrate; or forming a metal oxide layer of a thickness of 100~1500 Å as a semiconductor layer on the base substrate.

5. The method according to claim 1, wherein the step of sequentially forming the transparent conductive thin film and the gate metal thin film on the base substrate comprises:

depositing the transparent conductive thin film of a thickness of 300~600 Å and the gate metal thin film of a thickness of 1000~4000 Å on the base substrate.

* * * * *